(12) United States Patent
Holcomb et al.

(10) Patent No.: US 10,197,600 B2
(45) Date of Patent: Feb. 5, 2019

(54) OSCILLOSCOPE WITH INTERNALLY GENERATED MIXED SIGNAL OSCILLOSCOPE DEMO MODE STIMULUS, AND INTEGRATED DEMONSTRATION AND TRAINING SIGNALS

(75) Inventors: Matthew S. Holcomb, Colorado Springs, CO (US); Thomas Schmidt, Colorado Springs, CO (US); Dennis J. Weller, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1695 days.

(21) Appl. No.: 13/097,491

(22) Filed: Apr. 29, 2011

(65) Prior Publication Data
US 2012/0274313 A1 Nov. 1, 2012

(51) Int. Cl.
*G01R 13/20* (2006.01)
*G01R 13/02* (2006.01)

(52) U.S. Cl.
CPC .......... *G01R 13/029* (2013.01); *G01R 13/20* (2013.01)

(58) Field of Classification Search
CPC ............................ G01R 13/225; G01R 13/20
See application file for complete search history.

(56) References Cited

U.S. PATENT DOCUMENTS

| | | | |
|---|---|---|---|
| 4,251,754 A * | 2/1981 | Navarro | G01R 13/20 315/367 |
| 4,564,805 A | 1/1986 | Winter | |
| 4,585,975 A | 4/1986 | Wimmer | |
| 5,184,062 A | 2/1993 | Ladwig | |
| 5,621,433 A | 4/1997 | Acksteiner | |
| 6,651,016 B1 * | 11/2003 | Shaw | G01R 23/167 324/76.19 |
| 7,072,781 B1 | 7/2006 | Gershon et al. | |
| 7,271,575 B2 | 9/2007 | Pickerd et al. | |
| 7,529,641 B2 | 5/2009 | Sullivan | |
| 7,723,978 B2 | 5/2010 | Caffrey et al. | |
| 2004/0064282 A1 * | 4/2004 | Scott | G01R 13/0272 702/107 |
| 2005/0278129 A1 * | 12/2005 | Benvenga | G06F 11/2247 702/68 |

(Continued)

OTHER PUBLICATIONS

Eric Pan, DSO Nano v2 Manual v0.9B, published Aug. 25, 2010.*

(Continued)

*Primary Examiner* — Huy Q Phan
*Assistant Examiner* — Adam Clarke

(57) ABSTRACT

An oscilloscope includes at least one demonstration signal generator integrated as part of the oscilloscope. The demonstration signal generator generates stimulus signals that consist of digital samples of various different stored waveforms without the need of a separate demonstration board or signal source. The demonstration signal generator may loop through different sections of the stored waveforms to generate respective stimulus signals that include sequences of digital samples from the different waveforms in combination, to provide a broad range of stimulus signals. The stimulus signals may be displayed on the oscilloscope or output from the oscilloscope as demonstration mode stimulus signals to demonstrate the capabilities of the oscilloscope to customers or for training.

14 Claims, 3 Drawing Sheets

(56) References Cited

U.S. PATENT DOCUMENTS

| | | | | |
|---|---|---|---|---|
| 2006/0074606 A1* | 4/2006 | Pupalaikis | ......... | G01R 13/0272 702/189 |
| 2007/0281532 A1* | 12/2007 | Cannon | ............ | G01R 1/06788 439/318 |
| 2009/0146642 A1* | 6/2009 | Caffrey | ............ | G01R 19/2516 324/114 |
| 2009/0195536 A1 | 8/2009 | Louise et al. | | |
| 2011/0267036 A1* | 11/2011 | Kharrati | ............ | G01R 13/0254 324/121 R |
| 2012/0268101 A1* | 10/2012 | Weller | ............... | G01R 13/0254 324/76.11 |

OTHER PUBLICATIONS

Tonghui Electronic Co., User's Manual TDO3000 Series Oscilloscope, Second Edition, May 2010.*

"Lug." Merriam-Webster.com. Merriam-Webster, n.d. Web. Jun. 22, 2017.*

Instek GOS-620FG. Data Sheet [online]. Good Will Instrument Co., Ltd., [retrieved on Nov. 1, 2010, and was publicly available as of the U.S. filing date of the application]. Retrieved from the Internet: <URL: https://www.testequipmentdepot.com/instek/pdf/GOS-620FG.pdf>.

Tonghui TDO3000 series, "Digital Storage Oscilloscope." Data Sheet, pp. 2-7 [online]. Changzhou Tonghui Electronics, Co., Ltd., [retrieved on Nov. 1, 2010, and was publicly available as of the U.S. filing date of the application]. Retrieved from the Internet: <URL: https://www.globalmediapro.com/att/a/2/b/3/a2b3i0/tdo3000.pdf>.

Tonghui TDO3000 series, "The perfect group of Digital Storage Oscilloscope, Function/Arbitrary Waveform Generator." Brochure, pp. 1-8 [online]. Changzhou Tonghui Electronics, Co., Ltd., [retrieved on Nov. 1, 2010, and was publicly available as of the U.S. filing date of the application]. Retrieved from the Internet: <URL: http://www.tonghui.com.cn/en/Product/digital%20storage%20oscilloscope/370.html>.

Instek GOS-620FG, "20MHz Dual Trace Oscilloscope with Function Generator." User Manual, pp. 1-34, [online]. Good Will Instrument Co., Ltd., [retrieved on Nov. 1, 2010, and was publicly available as of the U.S. filing date of the application]. Retrieved from the Internet: <URL: http://www.gwinstek.com/en-global/products/Oscilloscopes/Analog_Oscilloscopes/GOS-630_GOS-620>.

PicoScope 6000 Series PC Oscilloscopes, User's Guide, pp. 1-20, [online]. Pico Technology, Ltd., 2009, [retrieved on Jan. 25, 2011]. Retrieved from the Internet: <URL: http://www.picotech.com/downloads>.

PicoScope 6000 Series PC Oscilloscopes, Programmer's Guide, pp. 1-102, [online]. Pico Technology, Ltd., 2009, [retrieved on Jan. 25, 2011]. Retrieved from the Internet: <URL: http://www.picotech.com/downloads>.

PicoScope 6 PC Oscilloscope Software, User's Guide, pp. 1-172, [online]. Pico Technology, Ltd., 2007-2010, [retrieved on Jan. 25, 2011]. Retrieved from the Internet: <URL: http://www.picotech.com/downloads>.

"Gwlnstek: GOS-620FG", Home>Product>Oscilloscopes>Analog>Oscilloscopes>GOS-620FG, Good Will Instrument Co., Ltd., 2010, p. 1.

* cited by examiner

OSCILLOSCOPE WITH INTERNALLY GENERATED MIXED SIGNAL OSCILLOSCOPE DEMO MODE STIMULUS, AND INTEGRATED DEMONSTRATION AND TRAINING SIGNALS

BACKGROUND

Oscilloscopes are complex instruments capable of measuring analog signals, parallel digital signals and serial digital signals, and providing traditional voltage versus time display. Oscilloscopes can also display automatic measurements of signal frequency and amplitude, and display measurements of the frequency domain of a signal using fast Fourier transforms (FFTs), measurements of the bus value of parallel input signals, and measurements of the packet value of serial digital inputs.

To demonstrate the capabilities of an oscilloscope to a potential customer during a sales process, a separate demonstration (demo) board may be manually connected to the oscilloscope and used as a signal source to provide multiple signal types for display. For complex signal types, it may be necessary to connect various external cables from the demo board to the oscilloscope. The oscilloscope must also be properly configured. In some instances, the demo boards may be reconfigurable. Demo boards may be expensive, which can be cost prohibitive because the demo boards are usually distributed to sales staff. Also, because of the complexity of oscilloscopes, it can be difficult to properly train and inform customers of the various oscilloscope operational modes. Written manuals may be provided to walk customers through self-training steps which may include connecting signals from a separate demo board or signal source to the oscilloscope inputs. In either case of demonstration or training, additional equipment is typically needed, increasing cost, time and difficulty.

There is thus a need to demonstrate an oscilloscope without the use of a separate demo board. There is also a need to provide customer training using a broad set of waveform types without the use of a separate demo board or signal source.

SUMMARY

In a representative embodiment, an apparatus integrated in a common housing, includes an oscilloscope; a signal generator configured to provide a stimulus signal comprising digital samples of stored waveforms; an analog processing stage connected to the signal generator to receive the stimulus signal, and configured to process the digital samples into a demonstration signal and to output the demonstration signal via at least one lug disposed on the common housing; and a digital processing stage connected to the signal generator to receive the stimulus signal, and configured to display the stimulus signal on the oscilloscope.

In a further representative embodiment, an apparatus integrated in a common housing includes an oscilloscope; a signal generator configured to provide a stimulus signal comprising digital samples of stored waveforms; an analog processing stage connected to the signal generator to receive the stimulus signal, and configured to process the digital samples into a demonstration signal; and at least one lug disposed on the common housing and configured to output the demonstration signal externally from the apparatus, wherein the signal generator stores a plurality of different waveforms, and is configured to provide the stimulus signal as including digital samples corresponding to at least two of the different waveforms.

In another representative embodiment, an apparatus integrated in a common housing includes an oscilloscope; a signal generator configured to provide a stimulus signal comprising digital samples of stored waveforms; and a multiplexer connected to a channel block to receive a digital signal that is external to the apparatus and to the demonstration signal generator, and configured to provide the digital samples and the digital signal for display on the oscilloscope.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
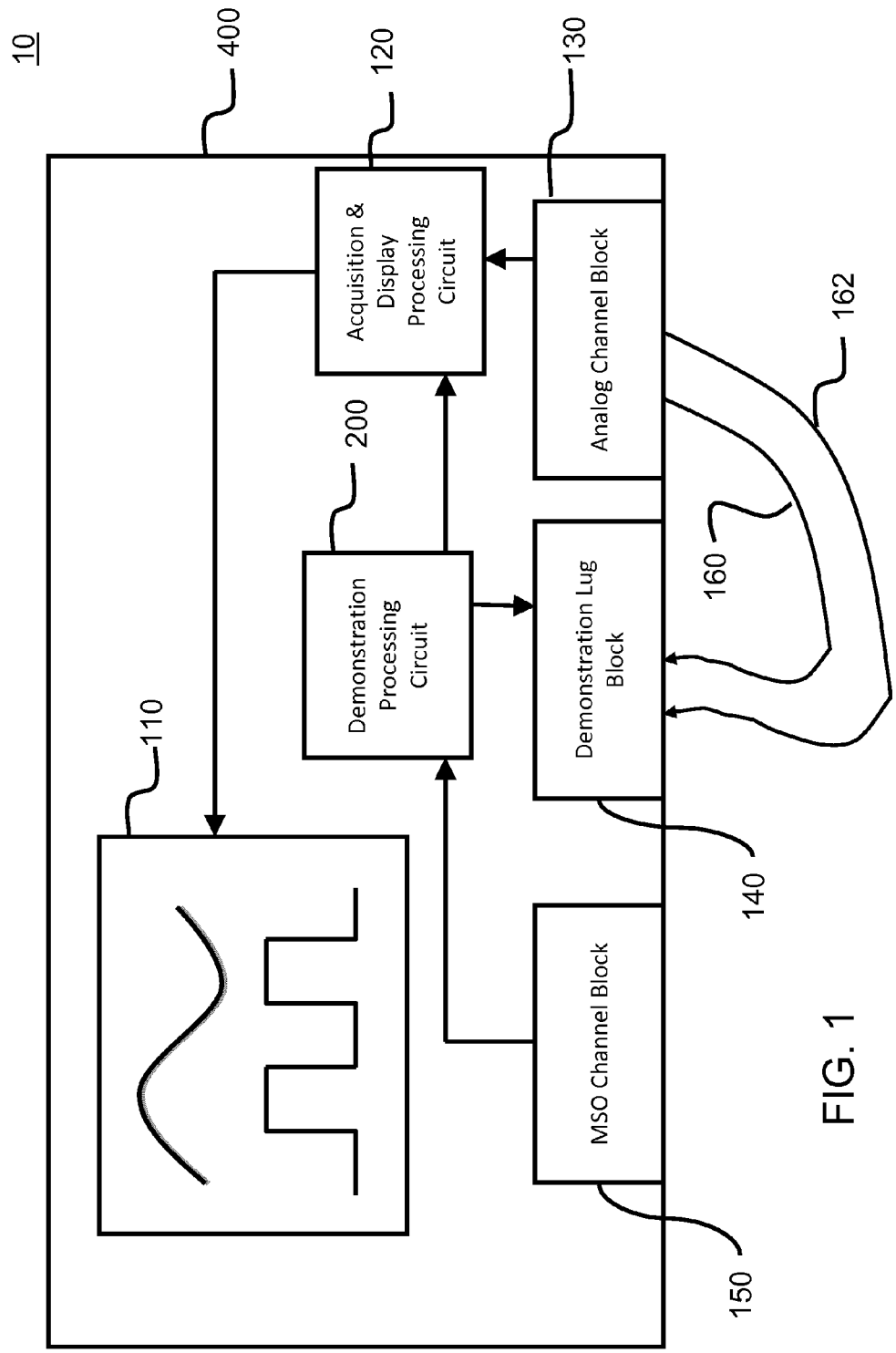
FIG. 1 is a block diagram illustrating a mixed signal oscilloscope with an integrated demonstration mode according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

FIG. 1 is a block diagram illustrating a mixed signal oscilloscope with an integrated demonstration mode according to a representative embodiment.

Referring to FIG. 1, the oscilloscope apparatus 10 may be a mixed signal oscilloscope (MSO), and as shown generally includes an oscilloscope display (oscilloscope) 110, acquisition and display processing circuit 120, analog channel block 130, demonstration lug block 140, MSO channel block 150 and demonstration processing circuit 200 integrated within common housing 400. Analog channel block 130, demonstration lug block 140 and MSO channel block 150 are externally accessible. Analog channel block 130 and MSO channel block 150 may each respectively include a plurality of channels. For example, analog channel block 130 may include 2 to 4 analog channels for reception of respective externally provided analog input signals, and MSO channel block 150 may include 8 to 32 MSO channels for reception of respective digital signals that are external to oscilloscope apparatus 10. Demonstration lug block 140 may include a plurality of demonstration lugs.

Demonstration processing circuit 200 as shown in FIG. 1 generates demonstration mode stimulus signals (demonstration signals) which may be provided externally from oscilloscope apparatus 10 via demonstration lug block 140. The demonstration mode stimulus signals are designed to demonstrate the features and capabilities of oscilloscope apparatus 10, and may be a variety of signals including sine waves, square waves, ramps, DC, noise, glitches, runt pulses, modulated waveforms and serial data, or any combination thereof. Although not necessary to this representative embodiment, oscilloscope probes 160 and 162 are shown as externally connecting the demonstration mode stimulus signals output from demonstration lug block 140 to analog channel block 130. In this manner, the demonstration mode stimulus signals output from demonstration lug block 140 may be input back into oscilloscope apparatus 10 and routed to acquisition and display processing circuit 120 for display on oscilloscope display 110. In an alternative, the externally provided demonstration mode stimulus signals output from demonstration lug block 140 may be connected to an oscilloscope (not shown) separate from oscilloscope apparatus 10, for display on the separate oscilloscope, for purposes of comparison.

Figure 2:
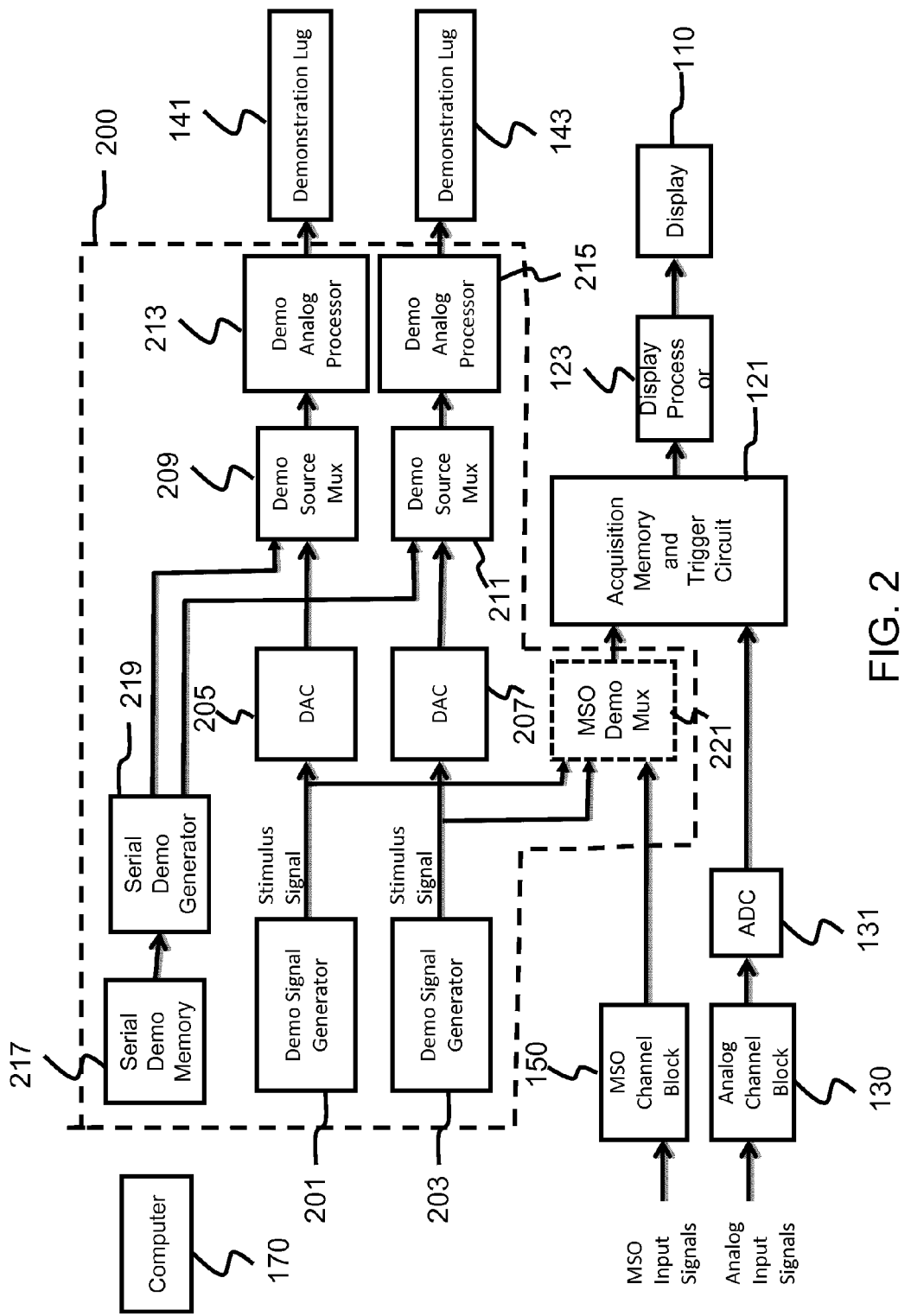
FIG. 2 is a block diagram illustrating greater detail of the mixed signal oscilloscope according to a representative embodiment.

FIG. 2 is a block diagram illustrating greater detail of the mixed signal oscilloscope according to a representative embodiment.

Oscilloscope apparatus 10 will now be described in greater detail referring to FIG. 2, wherein common housing 400 is not shown for simplicity. Demonstration processing circuit 200 includes various circuits, and in a representative embodiment may be implemented by an application specific integrated circuit (ASIC) or part of an ASIC, or by a field programmable gate array (FPGA) or part of an FPGA. In another representative embodiment, demonstration processing circuit 200 may be implemented by a micro-controller, or by discrete components, for example. Also, although interconnections are excluded to simplify FIG. 2, computer 170 may be interconnected with the various circuits as necessary. Computer 170 may be responsive to user selection to control the various circuits. In the alternative, control of the various circuits may be provided by an FPGA, an ASIC or switches, instead of or in addition to computer 170.

Demonstration processing circuit 200 includes demonstration (demo) signal generator 201 which outputs a stimulus signal that consists of digital samples of stored waveforms. The stimulus signal output from demonstration signal generator 201 is converted to an analog signal by digital-to-analog converter (DAC) 205. The analog signal output from digital-to-analog converter 205 is connected to demonstration (demo) source multiplexor 209. Somewhat similarly, demonstration (demo) signal generator 203 outputs a stimulus signal which consists of digital samples of stored waveforms. The stimulus signal output from demonstration signal generator 203 is converted to an analog signal by digital-to-analog converter (DAC) 207. The analog signal output from digital-to-analog converter 207 is connected to demonstration (demo) source multiplexor 211.

Serial demonstration (demo) memory 217 stores and outputs serial demonstration samples in the form serial patterns, such as, but not limited to common serial protocols of RS-233, SPI, and I2C signals for example. Serial demonstration (demo) generator 219 retrieves the serial demonstration patterns output from serial demonstration memory 217, and provides the retrieved serial demonstration patterns to demonstration source multiplexor 209 and demonstration source multiplexor 211.

As further shown in FIG. 2, demonstration source multiplexor 209 selectively switches between the analog signal from digital-to-analog converter 205 and the serial demonstration patterns from serial demonstration generator 219, and provides the switched output to demonstration analog processor 213. Demonstration analog processor 213 may include an anti-aliasing filter and an amplifier for example, and respectively filters and amplifies the switched output provided from demonstration source multiplexor 209. Demonstration source multiplexor 211 selectively switches between the analog signal from digital-to-analog converter 207 and the serial demonstration patterns from the serial demonstration generator 219, and provides the switched output to demonstration analog processor 215. Demonstration analog processor 215 may include an anti-aliasing filter and an amplifier for example, and respectively filters and amplifies the switched output provided from demonstration source multiplexor 211. The filtered and amplified outputs from demonstration analog processors 213 and 215 of demonstration processing circuit 200 are respectively provided to demonstration lugs 141 and 143 of demonstration lug block 140, and are output from oscilloscope apparatus 10 as the demonstration mode stimulus signals.

As still further shown in FIG. 2, MSO channel block 150 receives MSO input signals which may be digital signals that are external to oscilloscope apparatus 10. MSO channel block 150 may include comparators to convert the MSO input signals to digital signals. The digital signals are connected from the MSO channel block 150 to MSO demonstration (demo) multiplexor 221 of demonstration processing circuit 200. MSO demonstration multiplexor 221 selectively switches between the stimulus signals provided from demonstration signal generators 201 and 203 and the digital signal from MSO channel block 150, and provides the switched output to acquisition memory and trigger circuit 121. As also shown, the analog signals from analog channel block 130 are converted to digital samples by analog-to-digital converter (ADC) 131. The converted digital samples from analog-to-digital converter 131 are connected to acquisition memory and trigger circuit 121. Analog-to-digital converter 131 may be disposed as part of the analog channel block 130 shown in FIG. 1, or in another representative embodiment may be disposed separately from analog channel block 130.

Acquisition memory and trigger circuit 121 may include a circular memory (not shown) that stores converted digital samples from analog-to-digital converter 131 as analog measurements and that stores the switched output from MSO demonstration multiplexor 221 as digital measurements. During normal operation of oscilloscope apparatus 10, MSO demonstration multiplexor 221 switches to provide the digital signals from MSO channel block 150 to acquisition memory and trigger circuit 121 for storage as the digital measurements in the circular memory. For internally generated demonstration mode stimulus operation of oscilloscope apparatus 10, MSO demonstration multiplexor 221 switches to provide the stimulus signals from demonstration mode generators 201 and 203 to acquisition memory and trigger circuit 121 for storage as the digital measurements in the circular memory. Acquisition memory and trigger circuit 121 may also include trigger circuits (not shown) that detect trigger events within the switched output from MSO demonstration multiplexor 221 and the converted digital samples from analog-to-digital converter 131. In the alternative, the trigger events within the converted digital samples from analog-to-digital converter 131 may be detected using digital comparators that are disposed outside acquisition memory and trigger circuit 121 and demonstration processing circuit 200. Display processor 123 is connected to acquisition memory and trigger circuit 121, and processes the data stored in the circular memory of acquisition memory and trigger circuit 121 into waveforms for display on oscilloscope display 110. Display processor 123 may be disposed as part of acquisition and display processing circuit 120 shown in FIG. 1, or in another representative embodiment may be disposed separately from acquisition and display processing circuit 120.

Digital-to-analog converters 205 and 207, demonstration source multiplexors 209 and 211, and demonstration analog processors 213 and 215 taken together may be described as an analog processing stage that processes the stimulus signals from demonstration signal generators 201 and 203 into demonstration mode stimulus signals that are output externally from oscilloscope apparatus 10 via demonstration lugs 141 and 143. In contrast, MSO demonstration multiplexor 221, acquisition memory and trigger circuit 121 and display processor 123 taken together may be described as a digital processing stage that processes the stimulus signals from demonstration signal generators 201 and 203 into digital signals for display on oscilloscope display 110. Oscilloscope apparatus 10 may thus be characterized as having integrated therein both an analog processing stage and a digital processing stage.

Figure 3:
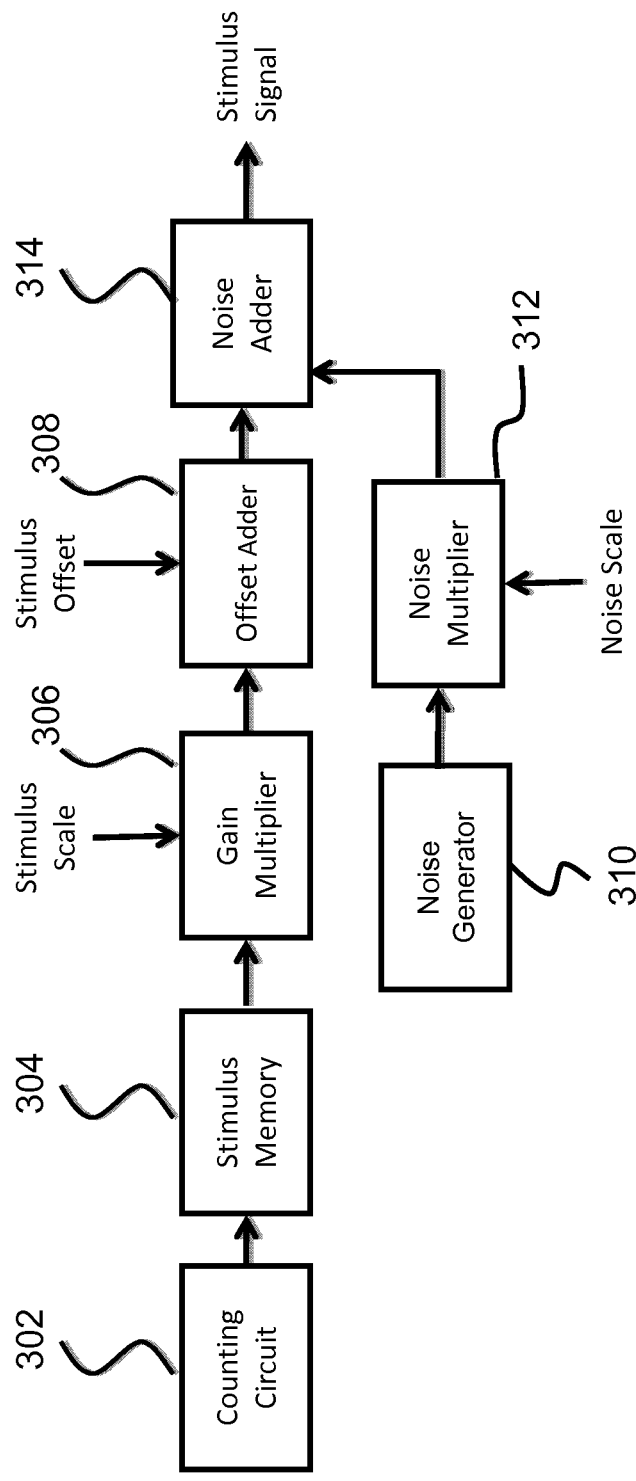
FIG. 3 is a block diagram illustrating a demonstration signal generator of an oscilloscope according to a representative embodiment.

FIG. 3 is a block diagram illustrating a demonstration signal generator of an oscilloscope according to a representative embodiment.

Referring to FIG. 3, the demonstration signal generator, such as demonstration signal generators 201 and 203, includes counting circuit (counter) 302 and stimulus memory 304 that together may function effectively as a direct digital synthesis (DDS) generator. Stimulus memory 304 stores digitized values of various different waveforms, such as sine waves, square waves, ramps, DC, noise, glitches, runt pulses, modulated waveforms and serial data. Under control of computer 170, counting circuit 302 generates and provides addresses to stimulus memory 304. Computer 170 may operate in response to user selection. Stimulus memory 304 outputs the digitized values of the stored waveforms as digital samples responsive to the addresses provided by the counting circuit 302. Counting circuit 302 and stimulus memory 304 are capable of looping through different sections of the waveforms stored in stimulus memory 304 to output sequences of digital samples from the different waveforms in various combinations. In this respect, counting circuit 302 and stimulus memory 304 are different than conventional DDS synthesizers, because stimulus signals of various types of different waveforms, including glitches, can be generated for display to demonstrate the capabilities of oscilloscope apparatus 10.

For example, counting circuit 302 and stimulus memory 304 may be controlled to function in a ping-pong mode to generate a stimulus signal consisting of a sequence of digital samples that alternate between digitized values of different stored waveforms. That is, under control of computer 170, a pair of start-stop points of different stored waveforms may be designated along with a frame count. The ping-pong mode is useful for generating stimulus signals having narrow, low frequency pulses and for generating stimulus signals having infrequent events such as glitches. Computer 170 may be programmed by user selection to provide a sequence of instructions to counting circuit 302, such as the following:

Start1=0
Stop1=1000
Frame1=10
Start2=2000
Stop2=3000
Frame2=1.

In this example, the digital samples of the stimulus signal output from stimulus memory 304 consist of digitized values of a stored first waveform located at memory address locations 0 to 1000 which are repeated 10 times, followed by digitized values of a stored second waveform located at memory address locations 2000 to 3000 which are repeated 1 time. The sequence may be controlled to then stop, or be repeatable. Also, as can be readily appreciated in view of this example, the number of times the digital samples corresponding to the stored first waveform repeats in the sequence and the number of times the digital samples corresponding to the stored second waveform repeats in the sequence are separately controllable. In this manner, a stimulus signal may be generated including a sequence of digital samples of a stored first waveform repeated a comparatively larger number of times, followed by a sequence of digital samples of a stored second waveform that may be slightly different than the stored first waveform and repeated a comparatively smaller or minimum number of times. Stimulus signals can thus be generated to mimic infrequently occurring glitches or artifacts, and such stimulus signals can be displayed on display 110 to demonstrate the capabilities of oscilloscope apparatus 10.

Counting circuit 302 and stimulus memory 304 may also be controllable so that playback speed of the digital samples within the stimulus signal is adjustable. For example, under control of computer 170, at a playback speed of 0.25, a stimulus signal including digital samples $S(0)$, $S(1)$, $S(2) \ldots$ , corresponding to the digitized values of a stored waveform, is output in a sequence as follows:

$S(0)/S(0)/S(0)/S(0)/S(1)/S(1)/S(1)/S(1)/S(2)/S(2)/S(2)/S(2)/ \ldots$ .

Likewise, under control of computer 170, at a playback speed of 3.0, a stimulus signal including digital samples $S(0)$, $S(1)$, $S(2) \ldots$ , corresponding to the digitized values of a stored waveform, is output in a sequence as follows:

$S(0)/S(3)/S(6)/S(9)/ \ldots$ .

In a representative embodiment, the playback speed has a resolution of 10.18, enabling fine tuning of the stimulus signal output from stimulus memory 304.

Counting circuit 302 and stimulus memory 304 may also be controllable to linearly interpolate the digitized values of the stored waveforms within stimulus memory 304. To illustrate the linear interpolation function, a stimulus signal having a playback speed of ½ and including a non-interpolated sequence of digital samples is first considered as follows:

S(0)/S(0)/S(1)/S(1)/S(2)/S(2)/ . . . .

Upon enablement of the interpolation feature under control of computer 170, the above noted considered stimulus signal is interpolated to include a sequence of digital samples as follows:

S(0)/½S(0)+½S(1)/S(1)/½S(1)+½S(2)/S(2) . . . .

In a representative embodiment, interpolation may be available for all playback speeds, including playback speeds greater than 1. As a further example, upon enablement of the interpolation feature and selection of a playback speed of 1.5, the stimulus signal output from stimulus memory 304 includes a sequence of digital samples as follows:

S(0)/½S(1)+½S(2)/S(3)/½S(4)+½S(5)/S(6)/ . . . .

Returning to FIG. 3, the demonstration signal generator as shown further includes gain multiplier 306, which is connected to stimulus memory 304 to receive the stimulus signal. The gain of gain multiplier 306 may be set by a stimulus scale signal under control of computer 170. The gain control provided by gain multiplier 306 may be used for fine adjustment of signal amplitude, to provide a gain controlled signal (first signal). In a representative embodiment, a gain resolution may be 10 bits or about 0.1%, for example. Incidentally, the gain is set to zero by computer 170 when the stimulus signal output from the demonstration signal generator is DC or a noise waveform.

As further shown in FIG. 3, the demonstration signal generator as shown further includes an offset adder (first adder) 308 which is connected to receive the output of gain multiplier 306. Offset adder 308 adds an offset to the output of gain multiplier 306. The offset added by offset adder 308 may be set by a stimulus offset signal under control of computer 170. The offset may be set between −512 and +511, for example, and when not used may be set to zero.

As still further shown in FIG. 3, the demonstration signal generator further includes noise generator 310 that generates random noise digital samples (noise samples) that may be added to the stimulus signal. The random noise digital sample values are output to noise multiplier 312, which scales the random noise digital sample values. The amplitude of the noise as scaled by noise multiplier 312 may be set by a noise scale signal under control of computer 170. In a representative embodiment, the peak to peak amplitude of the random noise digital sample values may be adjustably scaled between 0 and 1024, for example. If no noise is to be added to the stimulus signal, the noise scale signal is set to zero by computer 170. The output of offset adder 308 and the scaled output of noise multiplier 312 are added by noise adder (second adder) 314, which provides the stimulus signal output by the demonstration signal generator.

Accordingly, in a representative embodiment, oscilloscope apparatus 10 is configured to internally generate demonstration mode stimulus signals without the need of a separate and external demo board and signal source. Oscilloscope apparatus 10 can generate a broad range of interesting signals for demonstration and training using the above described ping-pong, interpolation and playback features, for example, without significantly large memory overhead. Moreover, noise can be efficiently added to an arbitrary signal.

While specific embodiments are disclosed herein, many variations are possible, which remain within the concept and scope of the present teachings. For example, oscilloscope apparatus 10 is described as a mixed signal oscilloscope (MSO). The representative embodiments described however may also be incorporated into analog oscilloscopes and digital storage oscilloscopes (DSO). Also, although oscilloscope apparatus 10 in FIG. 2 is described and shown as including a first stimulus signal path including demonstration signal generator 201, digital-to-analog converter 205, demonstration source multiplexor 209, demonstration analog processing circuit 213, and demonstration lug 141, and a corresponding second stimulus signal path including demonstration signal generator 203, digital-to-analog converter 207, demonstration source multiplexor 211, demonstration analog processing circuit 213, and demonstration lug 143, it is understood that alternative configurations of demonstration processing circuit 200 may include only one stimulus signal path or more than two stimulus signal paths, without departing from the scope of the present teachings. Moreover, although the demonstration signal generator of FIG. 3 is described and shown as including gain multiplier 306, offset adder 308, noise generator 310, noise multiplier 312 and noise adder 314, any or all of these components can be omitted from the demonstration signal generator in various alternative configurations. In the alternative, any or all of the stimulus scale signal, the stimulus offset signal and the noise scale signal as provided by computer 170 can be set to zero so that gain, offset and noise are not added to the stimulus signal. Also, in a representative embodiment, under control of computer 170, demonstration lugs 141 and 143 can be used to output probe compensation signals, thus eliminating the need of a separate probe compensation lug. Probe compensation signals are used to adjust or compensate the analog oscilloscope probes, and typically consist of a square wave having frequency of about 1 kHz and amplitude of about 2 or 3 volts, for example. In another representative embodiment, the stimulus signals provided by demonstration signal generators 201 and 203 can be provided external of oscilloscope apparatus 10 via at least one lug or connector and connected to MSO channel block 150 using an external cable. In still another representative embodiment, the stimulus signals provided by demonstration signal generators 201 and 203 may be internally connected to the analog channel block 130, eliminating the need for external probe connections. Such variations would become clear after inspection of the specification, drawings and claims herein. The invention therefore is not to be restricted except within the scope of the appended claims.

What is claimed is:

1. An apparatus integrated in a common housing, comprising:
    an oscilloscope;
    a signal generator comprising a memory configured to store waveforms; a counter configured to provide addresses to control an output of the memory; a multiplier configured to scale the output of the memory to provide a first signal; a first adder configured to add an offset to the first signal to provide a second signal; a noise generator configured to generate noise samples; and a second adder configured to add the noise samples and the second signal to provide a stimulus signal, the signal generator being configured to provide the stimulus signal comprising digital samples of stored waveforms the signal generator;
    an analog processing stage connected to the signal generator to receive the stimulus signal, and configured to process the digital samples into a plurality of demonstration signals and to output the demonstration signals via at least one lug disposed on the common housing;

at least one channel block configured to receive an analog signal for display on the oscilloscope;
an oscilloscope probe connectable to the at least one lug to externally couple the plurality of demonstration signals output from the at least one lug to the at least one channel block; and
a digital processing stage configured to demonstrate the plurality of demonstration signals provided to the at least one channel block on the oscilloscope.

2. An apparatus as claimed in claim 1, wherein the digital processing stage is connected to another channel block to receive a digital signal that is external to the apparatus, and configured to display the digital signal on the oscilloscope.

3. An apparatus as claimed in claim 1, wherein the stimulus signal is internally coupled to the digital processing stage.

4. An apparatus as claimed in claim 1, further comprising a memory configured to store and output serial demonstration patterns, wherein the analog processing stage is further configured to output the serial demonstration patterns as the demonstration signals via the at least one lug.

5. An apparatus as claimed in claim 1, further comprising:
at least one second signal generator configured to provide at least one second stimulus signal comprising second digital samples of stored waveforms,
the analog processing stage connected to the at least one second signal generator to receive the at least one second stimulus signal, and configured to process the second digital samples into a plurality of second demonstration signals and to output the second demonstration signals via at least one second lug disposed on the common housing.

6. An apparatus as claimed in claim 1, wherein the signal generator stores a plurality of types of different waveforms, and is configured to selectively output the digital samples corresponding to at least two of the different waveforms as the stimulus signal.

7. An apparatus as claimed in claim 6, wherein the stimulus signal output by the signal generator comprises a sequence of the digital samples including first samples corresponding to a first waveform from among the different waveforms and second samples corresponding to a second waveform from among the different waveforms.

8. An apparatus as claimed in claim 7, wherein a number of times the first samples are repeated in the sequence and a number of times the second samples are repeated in the sequence are separately controllable.

9. An apparatus as claimed in claim 7, wherein a number of times the sequence repeats is controllable.

10. An apparatus integrated in a common housing, comprising:
an oscilloscope;
an analog processing stage configured to process digital samples into a plurality of demonstration signals;
at least one lug disposed on the common housing and configured to output the demonstration signals externally from the apparatus;
at least one channel block;
an oscilloscope probe connectable to the at least one lug to externally couple the demonstration signals output from the at least one lug to the at least one channel block;
a digital processing stage configured to receive the demonstration signals from the at least one channel block and display the received demonstration signals on the oscilloscope; and
a signal generator comprising a memory configured to store waveforms; a counter configured to provide addresses to control an output of the memory; a multiplier configured to scale the output of the memory to provide a first signal; a first adder configured to add an offset to the first signal to provide a second signal; a noise generator configured to generate noise samples; and a second adder configured to add the noise samples and the second signal to provide the digital samples, the signal generator being configured to store a plurality of types of different waveforms, and to generate the digital samples as corresponding to at least two of the different waveforms, the signal generator.

11. An apparatus as claimed in claim 10, wherein the signal generator is configured to provide a sequence of the digital samples comprising first samples corresponding to a first waveform from among the different waveforms and second samples corresponding to a second waveform from among the different waveforms.

12. An apparatus as claimed in claim 11, wherein a number of times the first samples are repeated in the sequence and a number of times the second samples are repeated in the sequence are separately controllable.

13. An apparatus as claimed in claim 11, wherein a number of times the sequence repeats is controllable.

14. An apparatus as claimed in claim 10, further comprising:
a memory configured to store and output serial demonstration patterns, and
wherein the analog processing stage is connected to the memory to receive the serial demonstration patterns, and further configured to process the serial demonstration patterns into the demonstration signals.

* * * * *